US009391561B1

(12) United States Patent
Struble et al.

(10) Patent No.: US 9,391,561 B1
(45) Date of Patent: *Jul. 12, 2016

(54) LAMINATE-BASED VOLTAGE-CONTROLLED OSCILLATOR

(71) Applicant: M/A-COM Technology Solutions Holdings, Inc., Lowell, MA (US)

(72) Inventors: Wayne M. Struble, Franklin, MA (US); Eoin Carey, Cork (IE); Ronan G. Brady, Co Cavan (IE); Shane M. Collins, Cork (IE)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/926,354

(22) Filed: Oct. 29, 2015

Related U.S. Application Data

(63) Continuation of application No. 13/765,915, filed on Feb. 13, 2013, now Pat. No. 9,209,744.

(51) Int. Cl.
*H03B 5/12* (2006.01)
*H03B 7/06* (2006.01)

(52) U.S. Cl.
CPC .............. *H03B 7/06* (2013.01); *H03B 5/124* (2013.01); *H03B 5/1206* (2013.01); *H03B 5/1231* (2013.01); *H03B 2200/0008* (2013.01)

(58) Field of Classification Search
CPC .......... H03B 5/08; H03B 5/12; H03B 5/1206; H03B 5/1209; H03B 5/1215; H03B 5/1218; H03B 5/1228; H03B 5/1231; H03B 5/124; H03B 5/1243; H03B 2200/0008
USPC ...... 331/36 C, 108 C, 108 D, 117 FE, 117 R, 331/167, 177 V
See application file for complete search history.

(56) References Cited

U.S. PATENT DOCUMENTS

| | | | |
|---|---|---|---|
| 5,532,654 A * | 7/1996 | Ieki ..................... | H04L 27/12 331/107 A |
| 5,844,301 A | 12/1998 | Van Roosmalen ............ | 257/532 |
| 5,852,388 A | 12/1998 | Nakai et al. ................ | 331/177 V |
| 6,169,461 B1 * | 1/2001 | Andoh ................. | H03B 5/1231 331/107 SL |
| 6,388,535 B1 | 5/2002 | Otsuki et al. .............. | 331/177 R |
| 6,606,006 B1 | 8/2003 | Alexandersson .......... | 331/108 C |
| 6,653,906 B1 | 11/2003 | Knecht .................... | 331/107 DP |
| 6,946,919 B2 | 9/2005 | Knecht et al. ............... | 331/36 C |
| 7,026,881 B2 | 4/2006 | Kim et al. .................. | 331/117 R |
| 7,135,936 B2 * | 11/2006 | Rein .................... | H03B 5/1847 331/117 R |
| 7,142,067 B2 | 11/2006 | Aramata et al. ......... | 331/107 SL |
| 7,515,006 B2 | 4/2009 | Bagger et al. ............. | 331/117 D |
| 8,729,970 B2 | 5/2014 | Kawasaki ..................... | 331/115 |
| 2001/0050598 A1 * | 12/2001 | Mourant .................. | H03B 7/06 331/117 R |
| 2003/0228849 A1 * | 12/2003 | Wang .................... | H03B 5/1231 455/100 |
| 2006/0261902 A1 * | 11/2006 | Masuda ............... | H03B 5/1265 331/36 C |
| 2009/0134944 A1 * | 5/2009 | Lee ..................... | H03B 5/1221 331/48 |

* cited by examiner

*Primary Examiner* — Levi Gannon
(74) *Attorney, Agent, or Firm* — Christopher P. Maiorana, PC

(57) ABSTRACT

An apparatus having a substrate, a first die and a second die is disclosed. The substrate may include a circuit having an inductance. The first die may be (i) mounted on the substrate, (ii) connected to the circuit and (iii) configured to control a frequency of an oscillation of a signal in the circuit. The frequency is generally varied by adjusting a voltage in the first die. The second die may be (i) mounted on the substrate, (ii) connected to the circuit and (iii) configured to excite the signal. The apparatus generally forms a voltage-controlled oscillator.

20 Claims, 8 Drawing Sheets

LAMINATE-BASED VOLTAGE-CONTROLLED OSCILLATOR

This application relates to U.S. Ser. No. 13/765,915, filed Feb. 13, 2013, which is incorporated by reference in its entirety.

FIELD OF THE INVENTION

The present invention relates to electrical oscillators generally and, more particularly, to a method and/or apparatus for implementing a laminate-based voltage-controlled oscillator.

BACKGROUND OF THE INVENTION

Conventional voltage-controlled oscillators are often fabricated as monolithic devices in a semiconductor material. Such monolithic designs have good overall performance, repeatable performance across a given lot, simple packaging criteria and good reliability over a wide range of temperatures. However, designing monolithic voltage control oscillators typically involves considerable development costs and development time. Once the designs are complete, adjustments to the designs to meet new criteria are usually limited.

It would be desirable to implement laminate-based voltage-controlled oscillator.

SUMMARY OF THE INVENTION

The present invention concerns an apparatus having a substrate, a first die and a second die. The substrate may include a circuit having an inductance. The first die may be (i) mounted on the substrate, (ii) connected to the circuit and (iii) configured to control a frequency of an oscillation of a signal in the circuit. The frequency is generally varied by adjusting a voltage in the first die. The second die may be (i) mounted on the substrate, (ii) connected to the circuit and (iii) configured to excite the signal. The apparatus generally forms a voltage-controlled oscillator.

The objects, features and advantages of the present invention include providing a laminate-based voltage-controlled oscillator that may (i) provide high performance parts, (ii) be fabricated at low cost compared with conventional designs, (iii) provide flexible adjustments in frequency performance, (iv) accommodate future advances in semiconductor technology without a major redesign and/or (v) provide high Q varactors, inductors and transmission lines on a laminate substrate.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
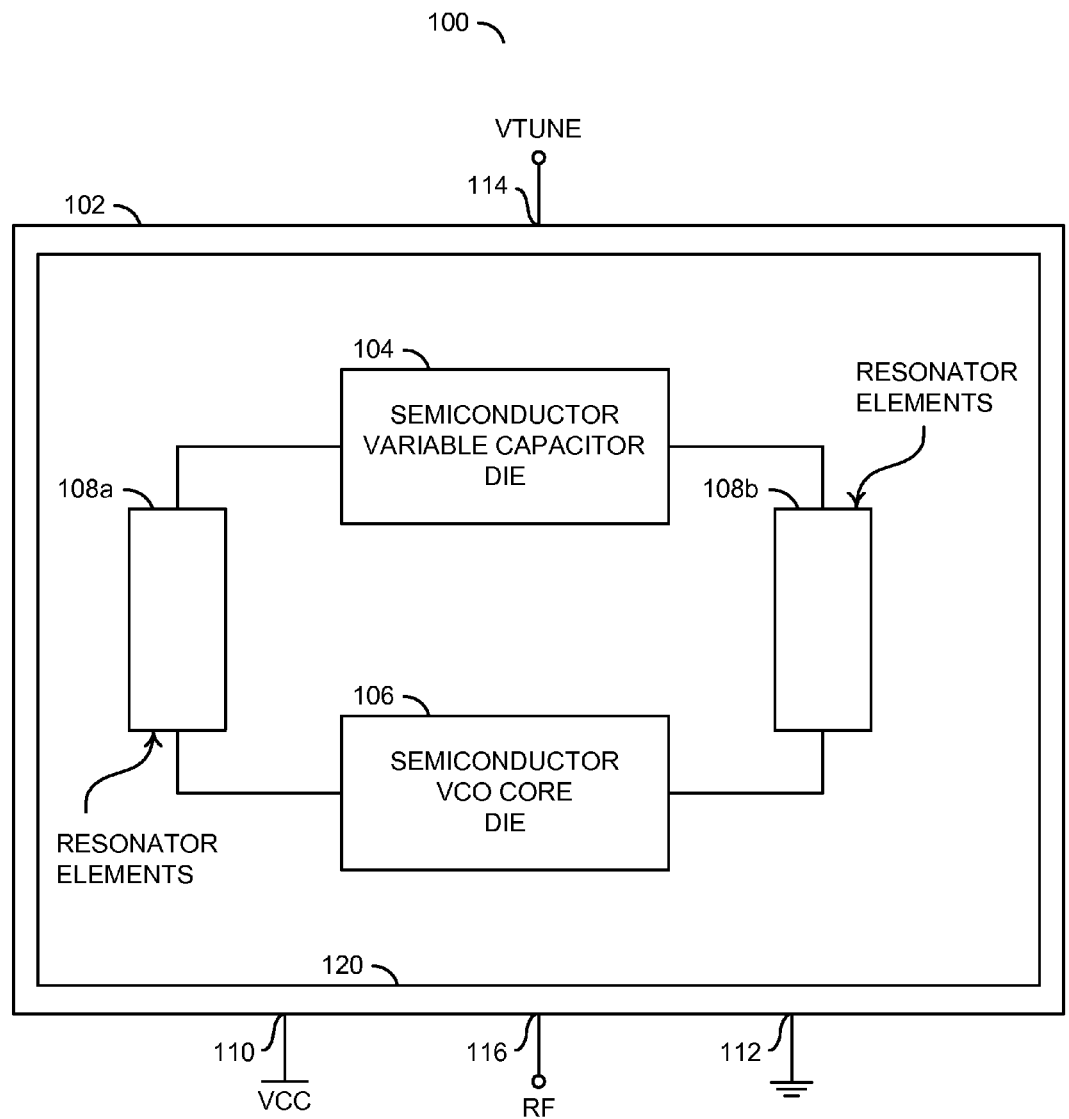
FIG. 1 is a block diagram of an apparatus in accordance with a preferred embodiment of the present invention.

Referring to FIG. 1, a block diagram of an apparatus 100 is shown in accordance with a preferred embodiment of the present invention. The apparatus (or circuit, or device, or assembly) 100 may implement a voltage-controlled oscillator based on a multilayer laminate substrate. The apparatus 100 may be based upon a high quality laminate substrate, with one or more discrete surface mount technology (e.g., SMT) devices and multiple (e.g., two) semiconductor dies (or chips) flip-chip bonded to the laminate substrate. All of the components may be interconnected through high-Q thick metal (e.g., copper) transmission lines. Once assembled, the apparatus 100 may be fully encapsulated to provide mechanical strength and isolation from the environment.

The apparatus 100 generally comprises a block (or circuit) 102, a block (or circuit) 104 and a block (or circuit) 106. The circuit 102 may comprise one or more blocks (or circuits) 108a-108b. Interfaces (or ports) 110 and 112 may provide electrical power (e.g., VCC and ground) to the apparatus 100. An interface (or port) 114 may receive a signal (e.g., VTUNE). The signal VTUNE may convey a voltage used to tune a frequency of oscillation in the apparatus 100. An interface (or port) 116 may present an output signal (e.g., RF). The signal RF may be an oscillating signal generated by the apparatus 100 at radio frequencies (e.g., 8 to 9 gigahertz). An encapsulation 120 may be formed over the circuits 102-108a for protection and mechanical support.

Dimensions of the apparatus 100 generally vary with the design of the circuits 102-108a. In some embodiments, the outer dimensions of the apparatus 100 may be approximately 5 millimeters (e.g., mm) in width, 5 mm in length and 1 mm in height (as viewed from a "bottom" side of the circuit 102). Other dimensions may be implemented to meet the criteria of a particular application.

The circuit 102 generally implements a laminate substrate. The circuit 102 generally provides mechanical support for the apparatus 100. Operationally, the circuit 102 may provide electrical interconnections on multiple layers among the circuits 104-108b. The circuit 102 may also provide resonance circuitry to partially establish the frequency of oscillation of the signal RF.

The circuit 104 may implement a variable capacitance die (or chip or integrated circuit). The circuit 104 may be mounted to the circuit 102 and connected directly to the circuits 108a-108b. The circuit 104 is generally operational to control an oscillation of the signal RF in said circuits 102-108b. A frequency of the oscillation is generally varied by adjusting a voltage of the signal VTUNE in the circuit 104. The signal VTUNE generally controls one or more variable capacitances formed in the circuit 104. In some embodiments, the circuit 104 may be fabricated in (on) a semiconductor die. The semiconductor may include, but is not limited to, silicon (e.g., Si), gallium arsenide (e.g., GaAs), and silicon germanium (e.g., SiGe) semiconductors.

The circuit 106 may implement an exciter (or negative resistance core) circuit. The circuit 106 may be mounted to the circuit 102 and connected directly to the circuits 108a-108b. The circuit 106 is generally operational to excite the signal RF to account for any power losses due to resistances, leakages and/or transmissions out of the port 116. The excite operation generally means one or more of amplifying, sustaining, building-up and/or energizing the signal RF. In some embodiments, the circuit 106 may be fabricated in (on) a semiconductor die (or chip or integrated circuit). The semiconductor may include, but is not limited to, silicon (e.g., Si), gallium arsenide (e.g., GaAs), and silicon germanium (e.g., SiGe) semiconductors. In some embodiments, the semiconductor type and/or transistor technology used in the circuit 106 may be the same as the semiconductor type and/or transistor technology used in the circuit 104. In other embodiments, the circuits 104 and 106 may be fabricated from different semiconductor materials and/or use different transistor technologies.

Each circuit 108a-108b may implement part of a resonator circuit. The circuit 108a-108b are generally operational to provide inductance, capacitances and/or delays used to establish the frequency of oscillation for the signal RF. The circuits 108a-108b may include, but are not limited to, transmission lines, inductors and capacitors. The circuit 108a-108b may be formed using one or more conductive layers of the circuit 102 and/or one or more surface mount devices.

Figure 2:
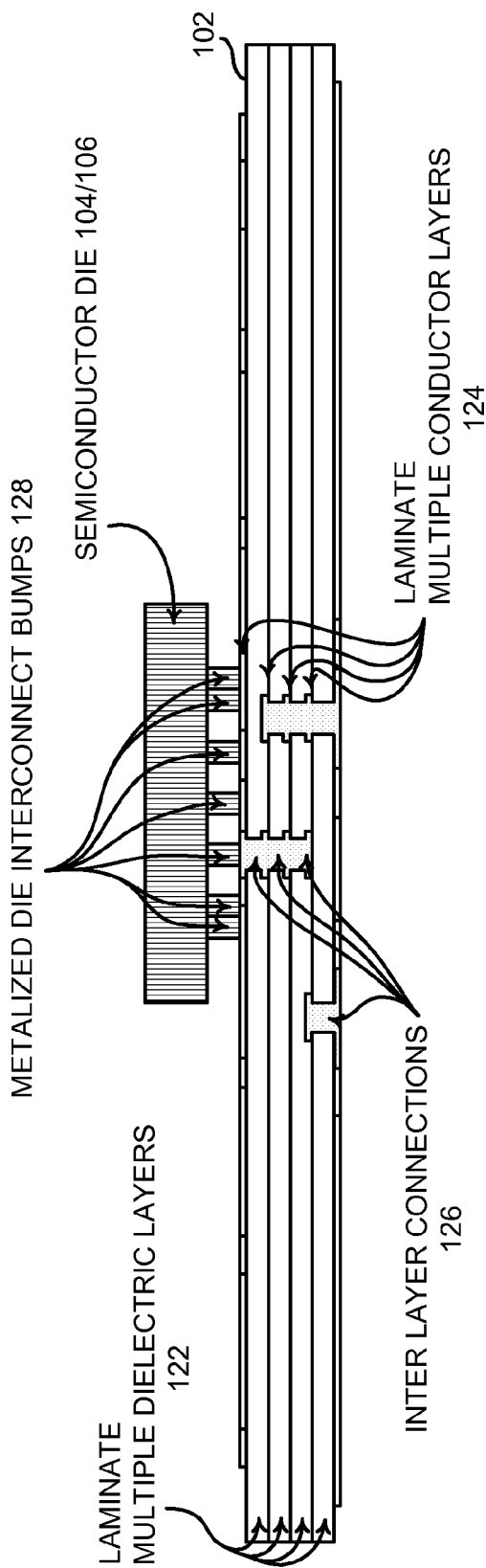
FIG. 2 is a cutaway cross sectional view of an example implementation of the apparatus.

Referring to FIG. 2, a cutaway cross sectional view of an example implementation of the apparatus 100 is shown. The circuit 102 generally comprises multiple dielectric layers 122 and multiple conductor layers 124. One or more interlayer connections (or vias) 126 may be formed between two or more of the conductor layers 124. The layers 124 at the outer surfaces may be implemented as a ground plane, a power plane and/or electrical traces/tracks in part.

The circuit 104 and 106 are shown flip-chip bonded to the circuit 102. The bonding generally comprises multiple metalized die interconnect (or solder) bumps 128. The bumps 128 generally connect bonding pads of the circuits 104 and 106 to an outer layer of the conductive layers 124. The bumps 128 may also provide mechanical support for the circuits 104 and 106. In some embodiments, the bumps 128 may be implemented in copper. Other interconnect bump technologies may be implemented to meet the criteria of a particular application.

Figure 3:
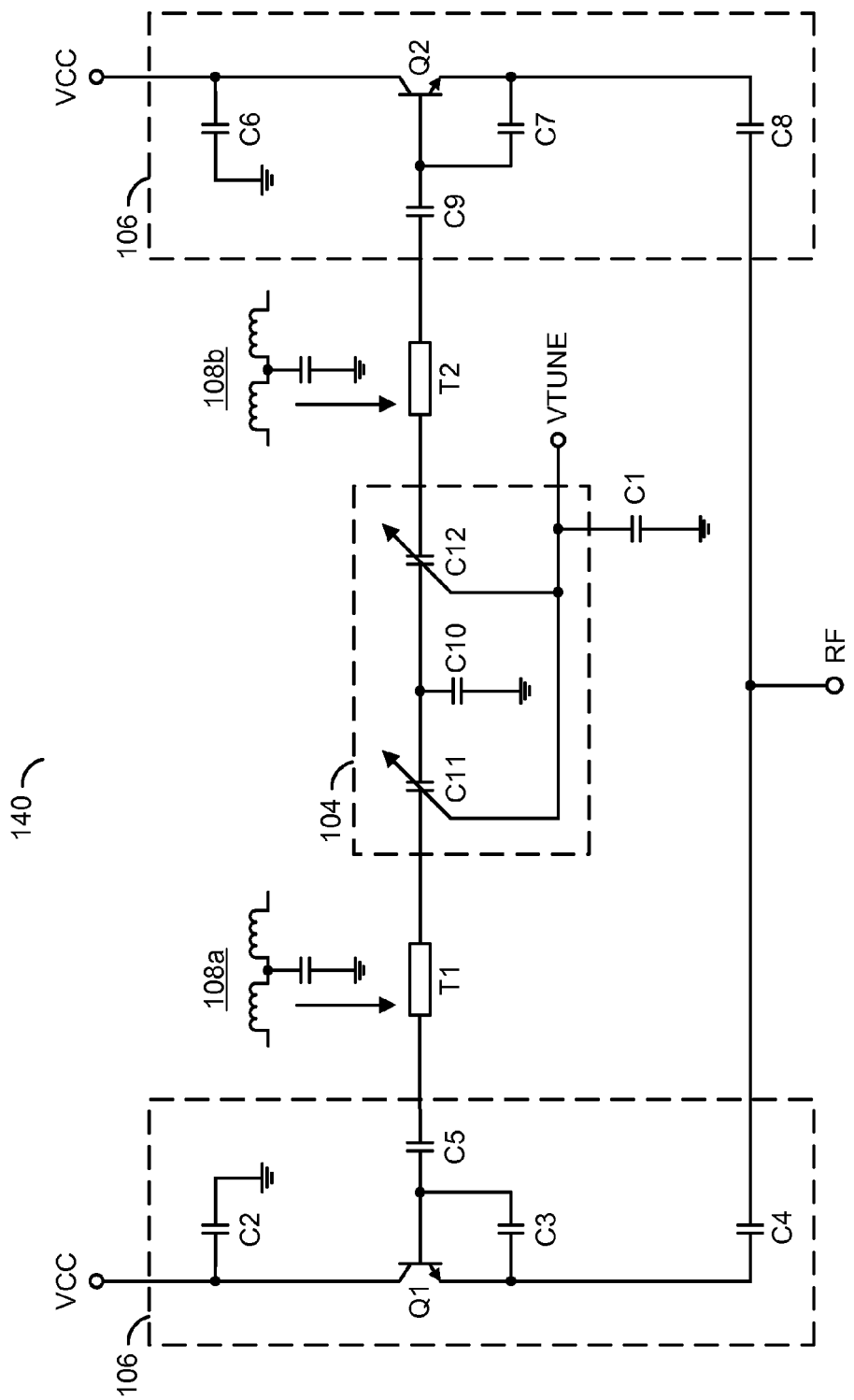
FIG. 3 is a radio frequency circuit schematic of an example implementation of the apparatus.

Referring to FIG. 3, a radio frequency circuit schematic 140 of an example implementation of the apparatus 100 is shown. In some embodiments, the apparatus 100 may be designed to implement a balanced VCO circuit. In other embodiments, the apparatus 100 may be designed to implement a single-ended VCO circuit.

The circuit 106 is shown forming multiple (e.g., two) amplifiers. An amplifier (e.g., on the left side) generally comprises a transistor Q1 and multiple capacitances C2-C5. Another amplifier (e.g., on the right side) generally comprises a transistor Q2 and multiple capacitances C6-C9. Additional bias circuitry involving resistances and/or inductances may also be included for normal operation of the transistors Q1 and Q2, but is omitted from the figure for simplicity.

Each amplifier may operate as a negative-resistance amplifier or a negative-transconductance (e.g., Gm) amplifier. In some embodiments, each amplifier may be implemented as a Clapp circuit. In other embodiments, each amplifier may be implemented as a Colpitt circuit. For differential designs, the amplifiers may be connected as cross-coupled amplifiers.

In some embodiments, each transistor Q1 and Q2 may be implemented as a heterojunction bipolar transistor (e.g., HBT). In other embodiments, each transistor Q1 and Q2 may be implemented as a bipolar junction transistor (e.g., BJT). The transistors Q1 and Q2 may also implement metal-oxide-semiconductor (e.g., MOS) transistors. In some embodiments, the transistors Q1 and Q2 may be implemented as pseudomorphic high electron mobility transistors (e.g., pHEMT). Other transistor technologies may be implemented to meet the criteria of a particular application. Some embodiments may contain more than two transistors.

The circuit 104 is shown forming a multiple (e.g., two) variable-capacitance circuit. The circuit 104 generally includes a fixed capacitance C10 and multiple (e.g., two) variable-capacitances C11 and C12. The capacitances C11 and C12 have variable capacitance values that may be controlled by the signal VTUNE. In some embodiments, the capacitances C11 and C12 may be junction capacitances formed in one or more bipolar junctions (e.g., diodes). In other embodiments, the capacitances C11 and C12 may be depletion region capacitances formed in one or more MOS devices. Normal bias circuitry for the capacitances C11 and C12 may be included in the design of the circuit 104 and/or the circuit 102. Other variable capacitance structures and technologies may be implemented to meet the criteria of a particular application.

All components of the schematic 140 outside the circuits 104 and 106 may form part of the circuit 102. In some embodiments, the circuit 102 may include, but is not limited to, the circuits 108a-108b and a capacitance C1. In some embodiments, the capacitance C1 may be implemented as an SMT capacitor. In other embodiments, the capacitance C1 may be implemented as plates in the layers 124 of the circuit 102 with the layers 122 acting as the dielectric.

Each circuit 108a-108h may implement a transmission line (or resonance track) T1 and T2, respectively. The transmission lines T1-T2 may be formed in and/or on the conductive layers 124 of the circuit 102, possibly also incorporating interlayer connections 126 and/or SMT devices. The transmission lines T1-T2 may behave electrically as a sequence of series inductances and capacitances to ground, as illustrated. Shapes of the transmission lines T1-T2 generally determine the resonance characteristics, and so the frequency of the signal RF.

By implementing the transmission lines T1-T2 on the circuit 102 instead of on a semiconductor, several advantages may be realized. For example, the area of the circuits 104 and/or 106 may be reduced thereby saving costs and improving fabrication yields. The transmission lines T1-T2 may also have lower loss and higher Q factors than similar transmission lines fabricated on a semiconductor substrate. The lower loss and higher Q factors generally lead to lower VCO phase noise, which is often a distinguishing performance parameter.

Figure 4:
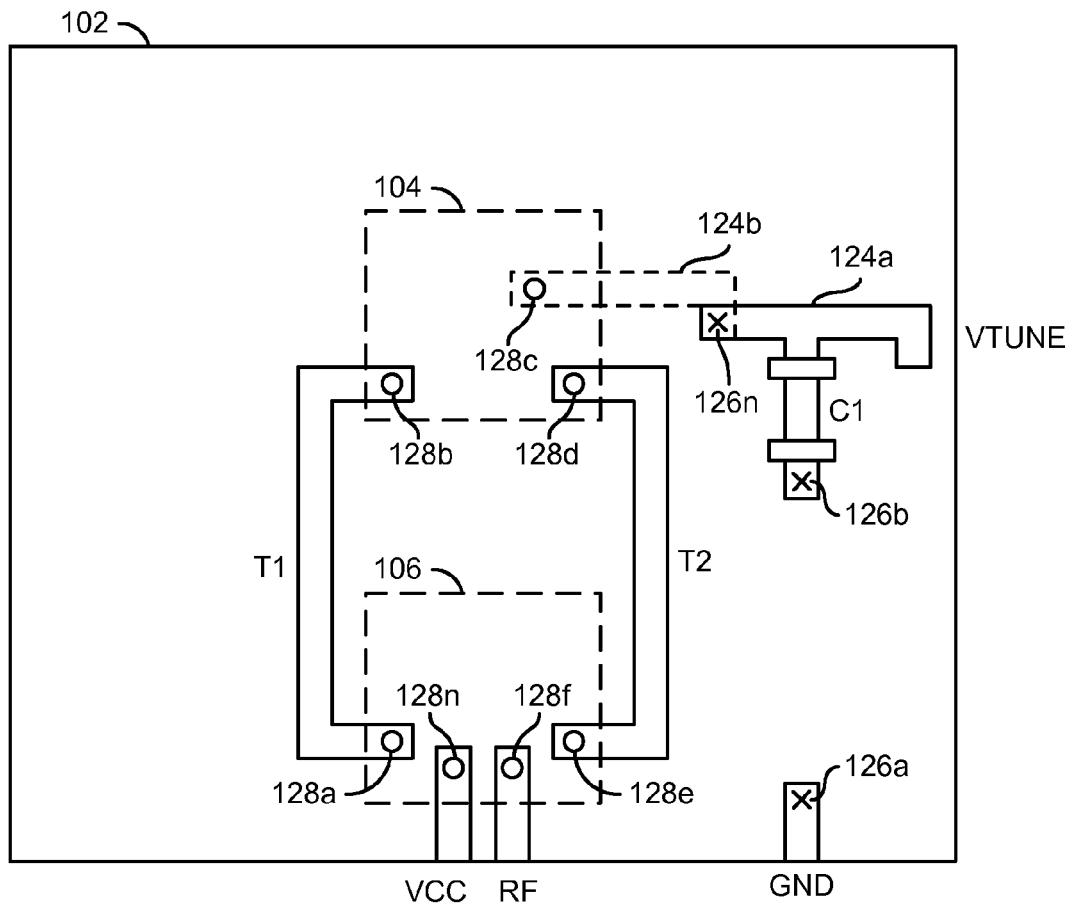
FIG. 4 is a diagram of an example implementation of a laminate circuit.

Referring to FIG. 4, a diagram of an example implementation of the circuit 102 is shown. The circuit 102 generally comprises the transmission lines T1-T2 (e.g., the circuits 108a-108b), multiple traces for the signals VCC, ground (e.g., GND), RF and VTUNE, and an SMT capacitor C1. The signal VTUNE is shown traversing multiple conductive layers (e.g., 124a and 124b) of the circuit 102. Several interlayer connections (e.g., 126a-126n) may be used to move various signals between the conductive layers 124. Interconnect bumps (e.g., 128a-128n) may be formed on the circuits 104 and 106 to provide electrical connections to the transmission lines T1-T2 and to the traces carrying the signals VTUNE, RF, VCC and GND. DC biasing elements (e.g., bias chokes) may also be implemented across one or more conductive layers of the circuit 102. The biasing elements are omitted from the figure for simplicity.

Figure 5:
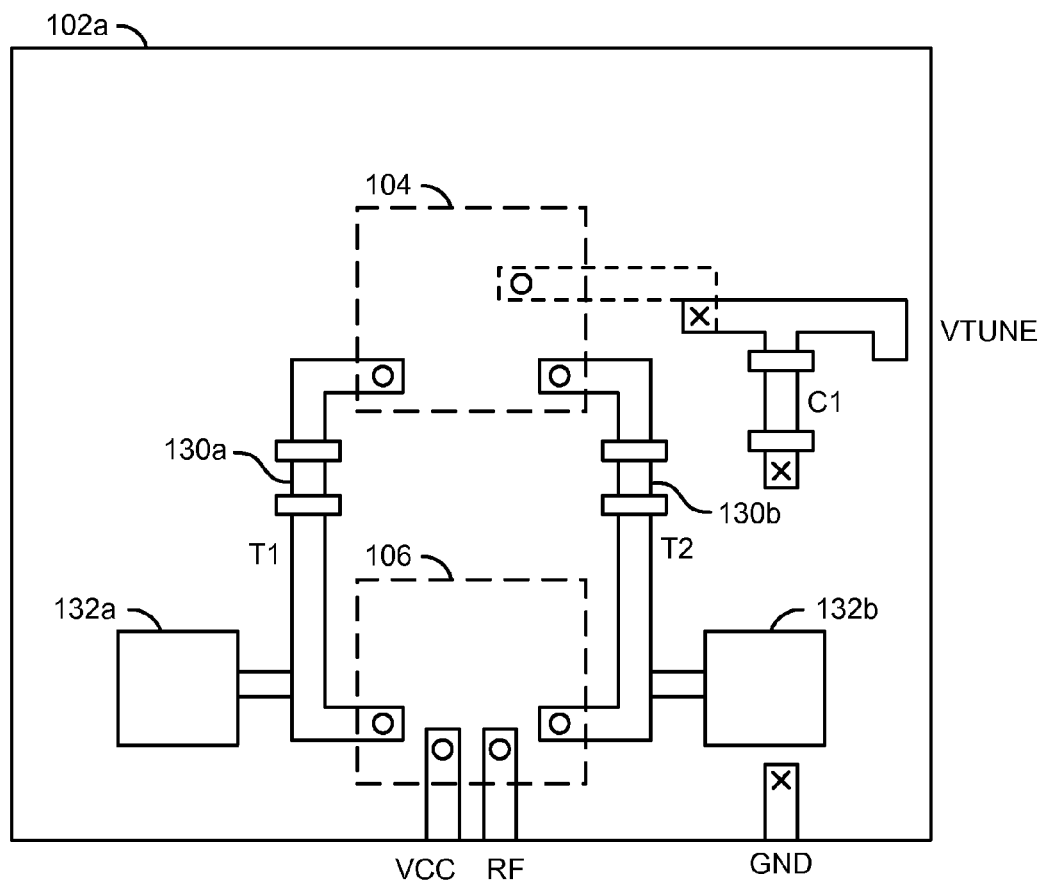
FIG. 5 is a diagram of another example implementation of the laminate circuit.

Referring to FIG. 5, a diagram of another example implementation of a circuit 102a is shown. The circuit 102a may be a variation of the circuit 102. Common elements between the circuits 102 and 102a are shown with the same reference numbers and names.

In addition to the transmission elements of the circuit 102, the circuit 102a may optionally include one or more blocks (or circuits) 130a-130b and one or more blocks (or circuits) 132a-132b. Each circuit 130a-130b may implement an SMT device (or component). In some embodiments, the circuits 130a-130b may include one or more inductances and/or one or more capacitances that contribute to the resonance characteristics of the circuit 102 (e.g., the circuits 108a-108b). In some embodiments, the circuits 130a-130b may be disposed at intermediate locations along the transmission lines T1-T2, thereby separating each transmission line T1-T2 into two segments. Other numbers, types and placements of the circuits 130a-130b may be implemented to meet the criteria of a particular application.

Each circuit 132a-132b may implement one or more components (or devices) formed within the circuit 102 (e.g., formed using the conductive layers 124 and/or the dielectric layers 122). In some embodiments, the circuits 132a-132b may include one or more inductances and/or one or more capacitances that contribute to the resonance characteristics of the circuit 102 (e.g., the circuits 108a-108b). In some embodiments, the circuits 132a-132b may be connected to the transmission lines T1-T2 at intermediate locations along the transmission lines T1-T2. The circuits 132a-132b may also be connected to the circuits 104 and/or 106. In such designs, the circuits 132a-132b may provide resistances and/or biasing schemes to the circuits 104 and 106 and/or other functions. Other numbers, types and placements of the circuits 132a-132b may be implemented to meet the criteria of a particular application.

In some embodiments, the circuit 102 may include a coupler to provide another output signal. The coupler may be inductively coupled to the resonant circuits 108a-108b. A shape of the coupler may be designed to generate the additional output signal at half the frequency of the signal RF.

By implementing the apparatus 100 in the circuits 102-132b, several advantages may be achieved. For example, the partitioning generally enables improved flexibility compared with common monolithic designs in mixing and matching different combinations of amplifier die (e.g., the circuit 106) and the varactor die (e.g., the circuit 104) technologies and designs on the circuit 102. Furthermore, the SMT devices (e.g., 130a-130b) may be introduced in series with the transmission lines T1-T2 to enable quick and simple adjustments to the VCO performance. Such adjustments may be implemented without changing semiconductor (e.g., the circuits 104-106) layouts or designs. The adjustments may also be made without changing the layout or design of the circuit 102. In other examples, changes to the circuit 102 to alter shape and/or number of transmission lines T1-T2 and/or add or modify embedded circuits (e.g., the circuits 132a-132b) may be performed with less design cost and time compared with changing custom semiconductor designs.

Figure 6:
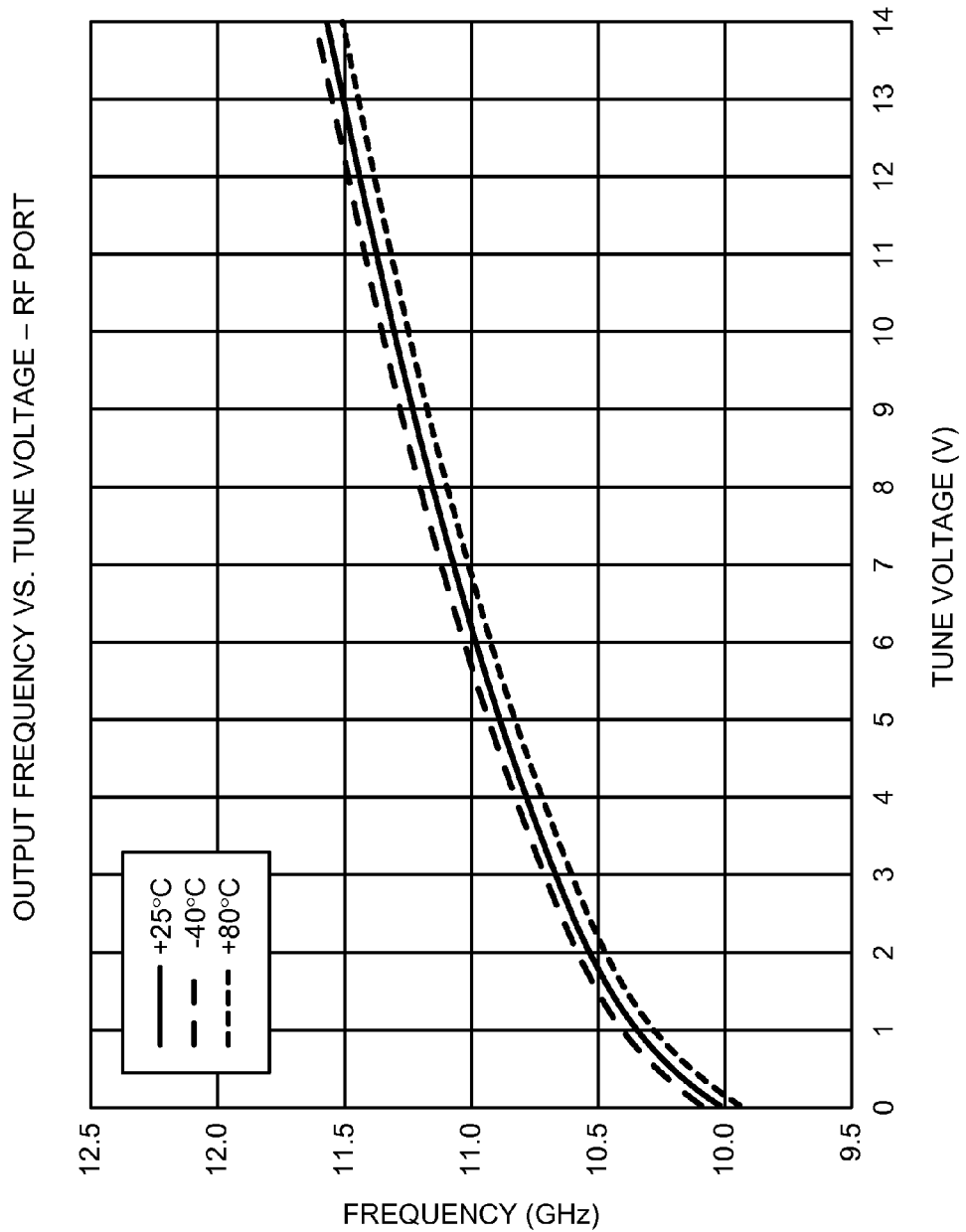
FIG. 6 is a graph of example curves for a frequency performance of a prototype of the apparatus.

Referring to FIG. 6, a graph of example curves for a frequency performance of a prototype of the apparatus 100 over the tuning signal is shown. A frequency of the signal RF in gigahertz (e.g., GHz) is shown along the Y-axis and the voltage of the signal VTUNE is shown along the X-axis.

Over an approximately 3.5 volt to 14 volt tuning range, the apparatus 100 generally operates in an approximately linear manner. Within an approximately 3 volt to 10.5 volt tuning range, a bandwidth of the signal RF is approximately 800 megahertz (e.g., MHZ).

Figure 7:
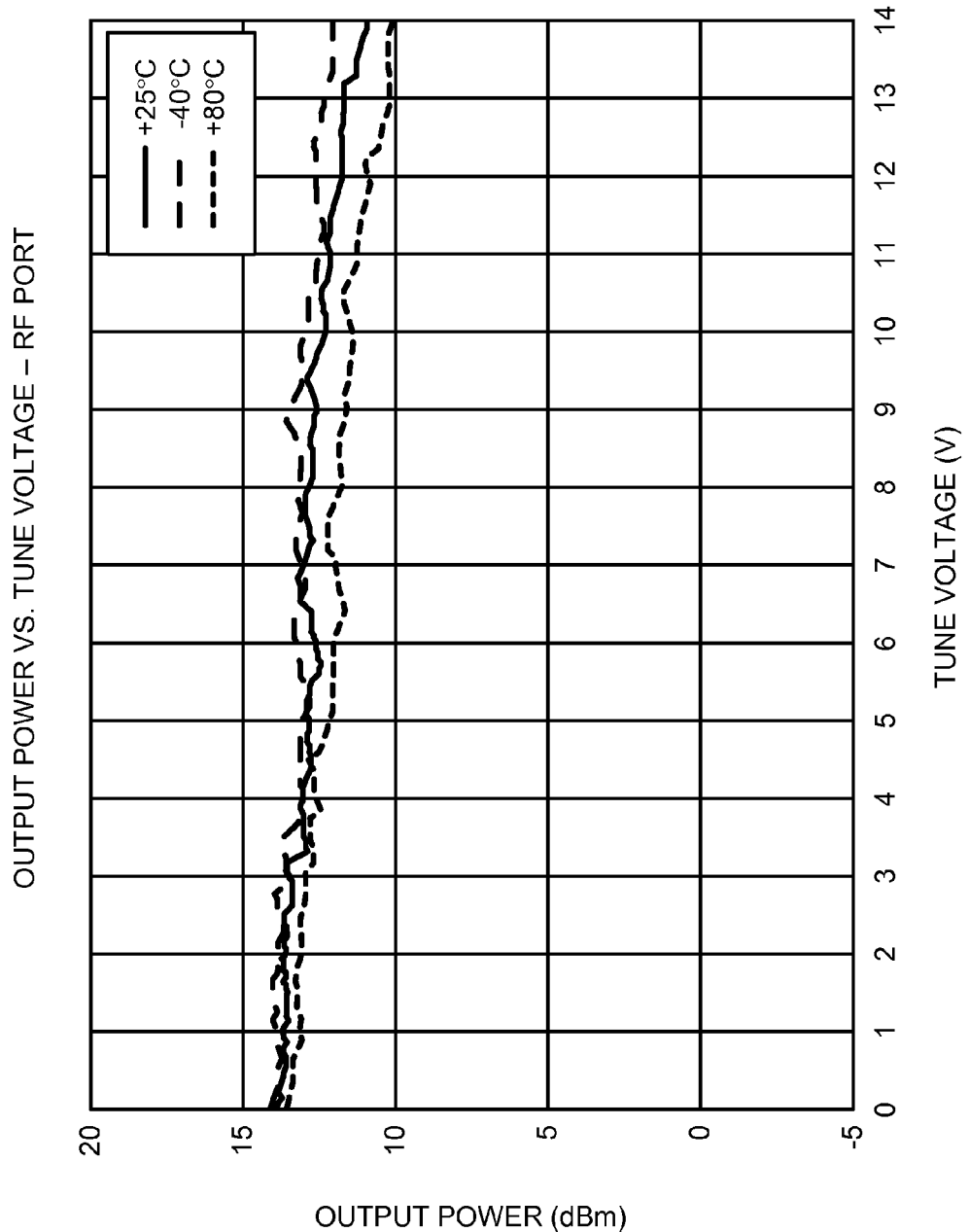
FIG. 7 is a graph of example curves for a power performance of the prototype.

Referring to FIG. 7, a graph of example curves for a power performance of the prototype over the tuning signal is shown. A power output of the signal RF measured in dBm (decibels of power referenced to one milliwatt) is shown along the Y-axis and the voltage of the signal VTUNE is shown along the X-axis. The power output is generally well behaved (e.g., >10 dBm target) and basically flat.

Figure 8:
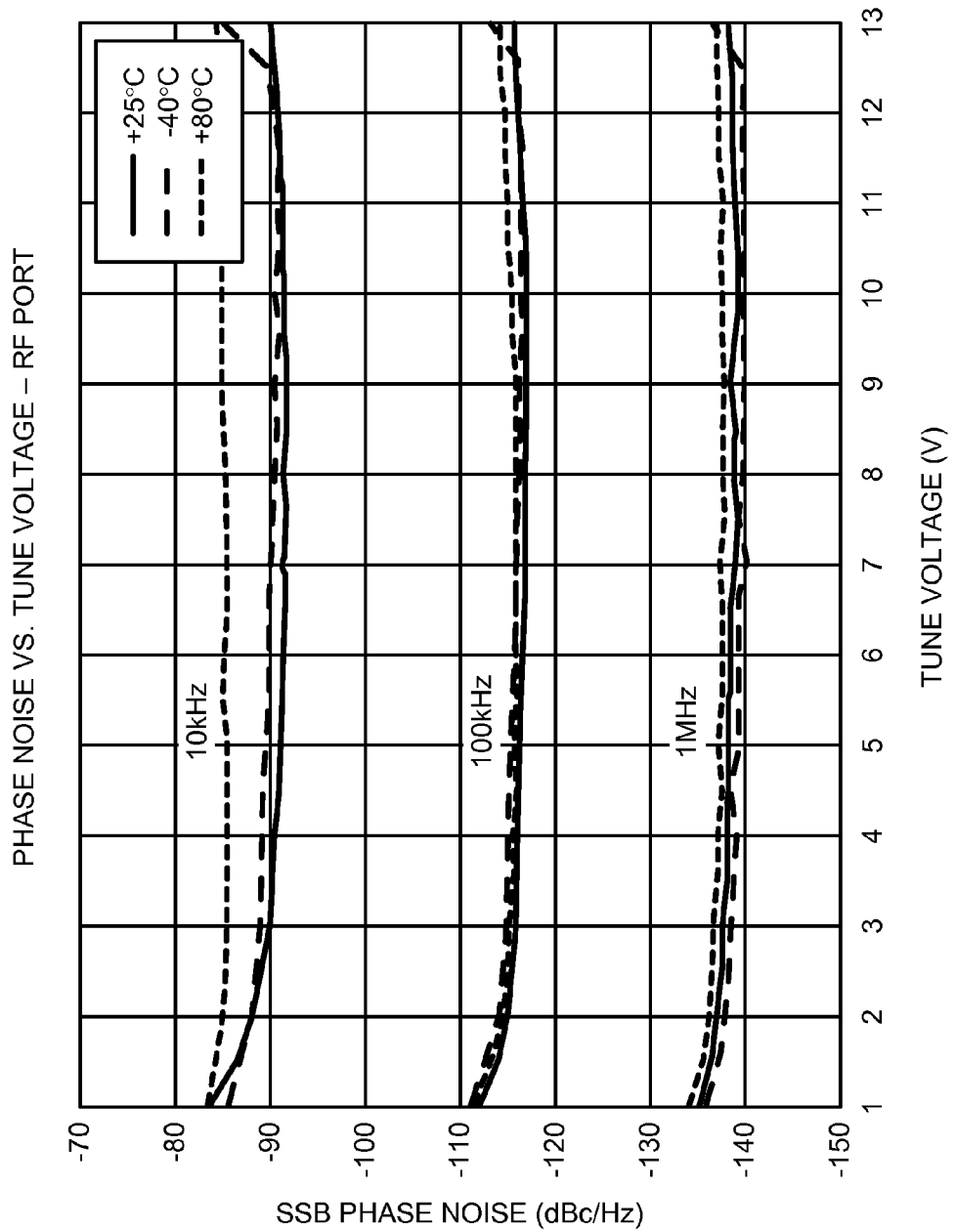
FIG. 8 is a graph of example curves for a phase noise performance of the prototype.

Referring to FIG. 8, a graph of example curves for a phase noise performance of the prototype over the tuning signal at three offset frequencies is shown. A single-sideband (e.g., SSB) phase noise of the signal RF measured in dBc/Hz (decibels relative to the carrier per hertz) is shown along the Y-axis and the voltage of the signal VTUNE is shown along the X-axis. The 100 kilohertz (e.g., kHz) phase noise of the apparatus 100 generally hovers around −114 to −115 dBc/Hz over the approximately 3 volt to 10.5 volt tuning range.

The apparatus 100 may provide multiple benefits over common VCO designs. For example, the apparatus 100 may provide high performance due to the high Q SMT varactors, inductors and transmission lines on a laminate substrate. Lower costs than monolithic designs may be achieved because the semiconductor dies generally contain only the active devices.

Adjustable SMT devices generally give flexibility in terms of quick and simple adjustments in the frequency performance without extensive simulations. Furthermore, the semiconductor die (e.g., the circuits 104-106) may be replaced by different technologies and/or types in the future with little impact on the resonator configuration. For example, a GaAs die could be replaced by SiGe active devices. In addition, the laminate platform enables the convenient integration of further functionality on the laminate substrate and/or one or more additional dies. For example, a phase locked loop may be incorporated to implement a full synthesizer. In another example a frequency multiplier chip may be included at the RF output of the above described oscillator to extend the effective frequency of operation to cover higher frequency bands.

The present invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), MMICs (monolithic microwave integrated circuits) two or more monolithic integrated circuits, two or more chips or die arranged as flip-chip modules and/or multi-chip modules or by interconnecting an appropriate network of conventional component circuits, as is described herein, modifications of which will be readily apparent to those skilled in the art(s).

While the invention has been particularly shown and described with reference to the preferred embodiments thereof, it will be understood by those skilled in the art that various changes in form and details may be made without departing from the scope of the invention.

The invention claimed is:
1. An apparatus comprising:
a substrate comprising (i) a plurality of inductors, (ii) a plurality of bonding pads and (iii) an output port;
a first chip (i) mounted on an outer surface of said substrate and (ii) comprising a plurality of variable capacitors that are (a) coupled to an end of said inductors through said bonding pads and (b) configured to control a frequency of a signal in said inductors; and
a second chip (i) mounted on said outer surface of said substrate, (ii) physically separate from said first chip and (iii) comprising a plurality of transistors that are (a) coupled to an opposite end of said inductors through said bonding pads and (b) configured to excite said signal in said inductors, wherein said signal is presented at said output port of said substrate.

2. The apparatus according to claim 1, further comprising a plurality of bonds connected to said bonding pads and configured to (i) couple said transistors and said variable capacitors to said inductors and (ii) couple said transistors to said output port.

3. The apparatus according to claim 1, wherein (i) said substrate is configured to convey a voltage through at least one of said bonding pads of said substrate to said first chip and (ii) said first chip is configured to vary said frequency of said signal based on said voltage.

4. The apparatus according to claim 3, wherein said signal is conveyed from said second chip through at least one of said bonding pads of said substrate to said output port of said substrate.

5. The apparatus according to claim 1, wherein said first chip and said second chip are fabricated from different types of semiconductor materials.

6. The apparatus according to claim 1, wherein (i) said inductors comprise a plurality of transmission lines and (ii) said frequency of said signal is based on one or more shapes of said transmission lines.

7. The apparatus according to claim 1, wherein (i) said substrate comprises one or more devices coupled to said inductors and (ii) said frequency of said signal is based on said devices.

8. The apparatus according to claim 7, wherein said one or more devices coupled to said inductors comprise one or more surface mounted devices mounted on said outer surface of said substrate.

9. The apparatus according to claim 8, wherein said one or more surface mounted devices is adjustable to change a frequency performance of said apparatus.

10. The apparatus according to claim 1, wherein said frequency of said signal is at least eight gigahertz.

11. The apparatus according to claim 1, wherein said substrate is a laminate substrate comprising a plurality of dielectric layers and a plurality of metal layers.

12. A method for voltage-controlled oscillation, comprising the steps of:
  (A) controlling a frequency of a signal in a plurality of inductors of a substrate with a first chip (i) mounted on an outer surface of said substrate and (ii) comprising a plurality of variable capacitors that are coupled to an end of said inductors through a plurality of bonding pads of said substrate;
  (B) exciting said signal with a second chip (i) mounted on said outer surface of said substrate, (ii) physically separate from said first chip and (iii) comprising a plurality of transistors coupled to an opposite end of said inductors through said bonding pads of said substrate; and
  (C) presenting said signal at an output port of said substrate.

13. The method according to claim 12, further comprising the steps of:
  coupling said transistors and said variable capacitors to said inductors through a plurality of bonds connected to said bonding pads; and
  coupling said transistors through said bonds to said output port.

14. The method according to claim 12, further comprising the steps of:
  conveying a voltage from said substrate through at least one of said bonding pads of said substrate to said first chip; and
  varying said frequency of said signal with said first chip based on said voltage.

15. The method according to claim 14, further comprising the step of:
  conveying said signal from said second chip through at least one of said bonding pads of said substrate to said output port of said substrate.

16. The method according to claim 12, wherein said first chip and said second chip are fabricated from different types of semiconductor materials.

17. The method according to claim 12, wherein (i) said inductors comprise a plurality of transmission lines and (ii) said frequency of said signal is based on one or more shapes of said transmission lines.

18. The method according to claim 12, wherein (i) said substrate comprises one or more devices coupled to said inductors and (ii) said frequency of said signal is based on said devices.

19. The method according to claim 12, wherein said frequency of said signal is at least eight gigahertz.

20. An apparatus comprising:
  means for supporting (i) a plurality of inductors, (ii) a plurality of bonding pads and (iii) an output port;
  means for controlling a frequency of a signal in said inductors, (i) coupled to an end of said inductors through said bonding pad and (ii) mounted on an outer surface of said means for supporting; and
  means for exciting said signal in said inductors, (i) coupled to an opposite end of said inductors through said bonding pads, (ii) mounted on said outer surface of said means for supporting and (iii) physically separate from said means for controlling, wherein said signal is presented at said output port of said means for supporting.

* * * * *